(12) United States Patent
Chen et al.

(10) Patent No.: US 10,790,331 B2
(45) Date of Patent: Sep. 29, 2020

(54) DISPLAY PANEL

(71) Applicant: PLAYNITRIDE INC., Zhubei, Hsinchu County (TW)

(72) Inventors: Pei-Hsin Chen, Zhubei (TW);
Yi-Ching Chen, Zhubei (TW);
Yi-Chun Shih, Zhubei (TW); Yu-Chu Li, Zhubei (TW); Ying-Tsang Liu, Zhubei (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 16/515,267

(22) Filed: Jul. 18, 2019

(65) Prior Publication Data
US 2020/0027918 A1 Jan. 23, 2020

(30) Foreign Application Priority Data

Jul. 20, 2018 (TW) .............................. 107125105 A (51) Int. Cl.
*H01L 27/15* (2006.01)
*H01L 33/62* (2010.01)

(52) U.S. Cl.
CPC ............ *H01L 27/156* (2013.01); *H01L 33/62* (2013.01)

(58) Field of Classification Search
CPC ............................... H01L 27/156; H01L 33/62
See application file for complete search history.

(56) References Cited

U.S. PATENT DOCUMENTS

| | | | |
|---|---|---|---|
| 6,496,973 B1* | 12/2002 | Kusuda | B41J 2/45 716/55 |
| 8,749,737 B2 | 6/2014 | Chen et al. | |
| 9,858,847 B2* | 1/2018 | Matsueda | G09G 3/3233 |
| 9,893,321 B2* | 2/2018 | Tokuda | H01L 27/322 |
| 2009/0322215 A1* | 12/2009 | Sung | H01L 51/5265 313/504 |
| 2016/0155755 A1* | 6/2016 | Liu | H01L 29/78633 257/72 |
| 2016/0372514 A1 | 12/2016 | Chang et al. | |
| 2017/0207281 A1* | 7/2017 | Hack | H01L 27/322 |
| 2019/0013298 A1* | 1/2019 | Lai | H01L 25/0753 |
| 2019/0043844 A1 | 2/2019 | Liu et al. | |
| 2019/0073944 A1 | 3/2019 | Li | |
| 2019/0280055 A1* | 9/2019 | Hack | H01L 51/5209 |
| 2019/0296093 A1* | 9/2019 | Liu | H01L 27/3218 |
| 2019/0378873 A1* | 12/2019 | Lee | H01L 33/02 |

FOREIGN PATENT DOCUMENTS

TW 201701458 A 1/2017

* cited by examiner

*Primary Examiner* — Victor A Mandala
(74) *Attorney, Agent, or Firm* — JCIPRNET (57) ABSTRACT

A display panel comprises a first substrate and a shading layer. The first substrate comprises a plurality of pixel zones arranging in an array form. Each of the pixel zones comprises a first color LED and a second color LED. The first color LED comprise a first light-emitting surface in a display direction. The second color LED comprise a second light-emitting surface in the display direction. An area of the first light-emitting surface is larger than an area of the second light-emitting surface. The shading layer is disposed in the plurality of pixel zones, and the shading layer overlaps some of the first light-emitting surfaces at the display direction.

10 Claims, 11 Drawing Sheets

DISPLAY PANEL

CROSS-REFERENCE TO RELATED APPLICATIONS

This non-provisional application claims priority under 35 U.S.C. § 119(a) on Patent Application No(s). 107125105 filed in Taiwan on Jul. 20, 2018, the entire contents of which are hereby incorporated by reference.

TECHNICAL FIELD

This disclosure relates to a display panel, and more particularly to a display panel with micro light-emitting diodes.

BACKGROUND

In the structure of current display panels, a plurality of pixels is disposed in the display area, and a plurality of sub-pixels are disposed in each pixel. Each sub-pixel can emit lights in different colors. In general, sub-pixels are configured to emit red, green, and blue lights respectively. Each sub-pixel can be separately driven to emit said lights of a predetermined intensity. Under an appropriate pixel size ratio, the colorful lights of the pixels will be mixed into one color in the human visual perception. As a result, the display panel can provide a vivid display image to the viewer.

However, in practice, because of the limitation of materials or manufacture processes, sub-pixels with different colors may have different luminous efficiencies and thus affect the light-mixing effects provided by the pixels. Currently, the luminous efficiency is usually compensated by adjusting the voltage or current. On the other hand, lights emitted by different pixels should be independent to each other, without interfering with each other in an ideal situation. However, actually, the light emitted by each pixel has no specific directionality but diverges in all directions, so adjacent pixels easily affect each other. Therefore, there is a need for a panel architecture to overcome such problems.

SUMMARY

The present disclosure provides a display panel to overcome the problems caused by the different luminous efficiencies and the different sizes of the different colored LEDs.

According to one or more embodiments of this disclosure, a Micro LED display panel is disclosed in this present disclosure. The Micro LED display panel comprises a first substrate and a shading layer. The first substrate has a plurality of pixel zones arranged in an array form. Each of the pixel zones comprises a first color LED and a second color LED. The first color LED comprises a first light-emitting surface facing to a display direction, the second color LED comprises a second light-emitting surface facing to the display direction, and an area of the first light-emitting surface is larger than an area of the second light-emitting surface. The shading layer is disposed in the pixel zones, and the shading layer covers part of the first light-emitting surfaces.

BRIEF DESCRIPTION OF THE DRAWINGS

The present disclosure will become more fully understood from the detailed description given herein below and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
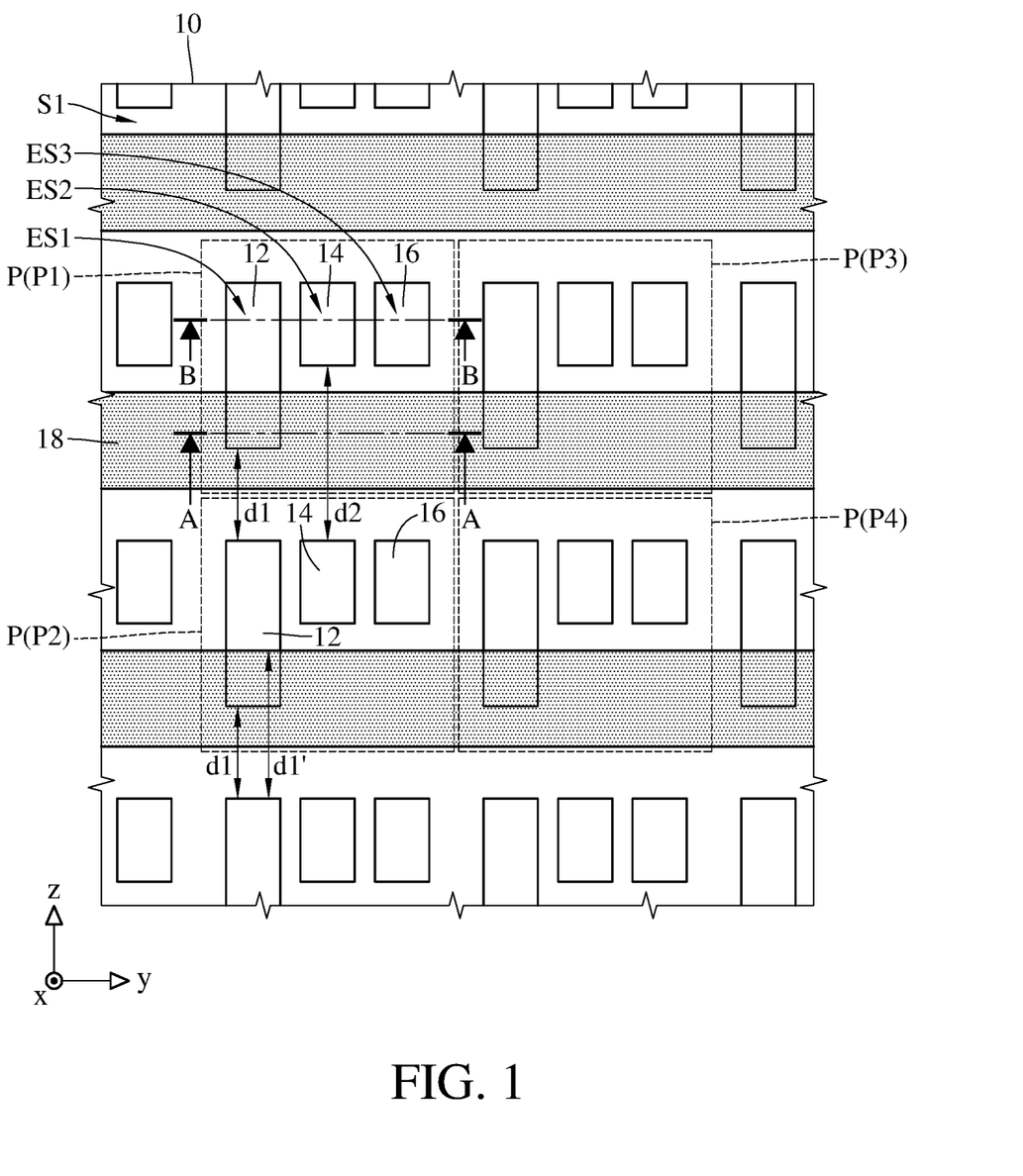
FIG. 1 is a structural schematic diagram of a display panel according to the first embodiment of the present disclosure.
Figure 2A:
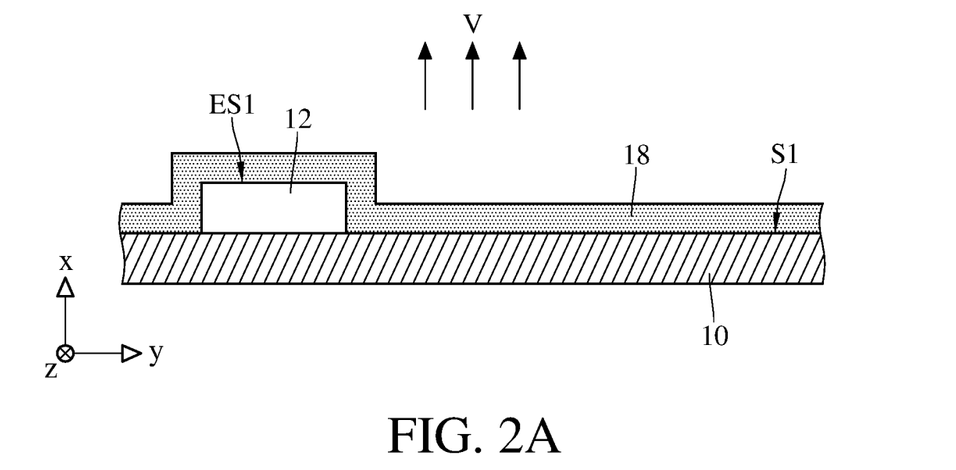
FIG. 2A is a schematic cross-sectional view showing an embodiment of a display panel according to the AA line of FIG. 1.
Figure 2B:
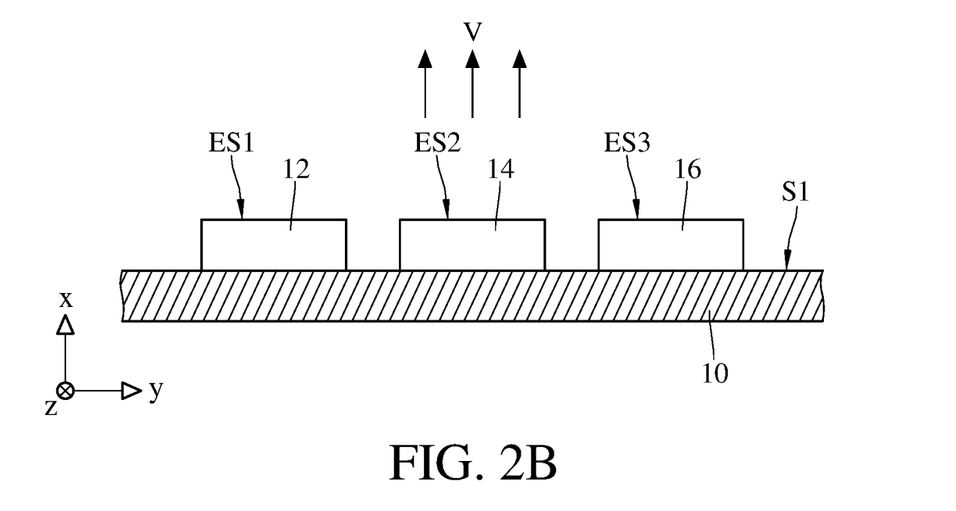
FIG. 2B is a schematic cross-sectional view showing an embodiment of a display panel according to the BB line of FIG. 1.

Please refer to FIG. 1, FIG. 2A and FIG. 2B. FIG. 1 is an overlook schematic diagram according to the display panel in the first embodiment, FIG. 2A is a cross-sectional schematic diagram according to the AA line of FIG. 1, and FIG. 2B is a cross-sectional schematic diagram according to the BB line of FIG. 1. A display panel comprises a first substrate 10, a plurality of first color LEDs 12, a plurality of second color LEDs 14, a plurality of third color LEDs 16 and a shading layer 18. The display panel has a display direction V. The display direction V is the direction that images show to the viewers. For example, the display direction V is in the positive x-axis and points away from the paper in FIG. 1, and the display direction V is in the positive x-axis direction and points up in FIG. 2A and FIG. 2B. The first substrate 10 includes a plurality of pixel zones P and a first surface S1, wherein the first surface S1 faces to the display direction V. Also, the shading layer 18 is disposed in the plurality of pixel zones P. The pixel zones P are arranged in an array form, and every pixel zone P comprises one of the first color LEDs 12, one of the second color LEDs 14, and one of the third color LEDs 16. The first color LED 12 comprises a first light-emitting surface ES1 facing to the display direction V, the second color LED 14 comprises a second light-emitting surface ES2 facing to the display direction V, and the third color LED 16 comprises a third light-emitting surface ES3 facing to the display direction V. Specifically, the first color LED 12, the second color LED 14, and the third color LED 16 are electrically connected to the first substrate 10 and disposed on the first surface S1.

The first color LED 12, the second color LED 14, and the third color LED 16 are Micro Light-emitting diode (Micro LED). The following examples are shown in case that the first color LED 12 emits red light, the second color LED 14 emits blue light, and the third color LED 16 emits green light. In practice, the luminous efficiency of the first color LED 12, the second color LED 14 and the third color LED 16 will be effected by their sizes, especially the first color LED 12 which emits red light. When the first color LED 12 is made in miniature size (for example, implemented by micro LED, length of micro LED is smaller than 150 um, thickness of micro LED is smaller than 15 um), the luminous efficiency of the first color LED 12 decreases obviously. Even though calibrating the current and the voltage by systems or software for compensation may be provided to increase the electrical power consumption, it is still hard to make the first color LED 12 emits red light with enough luminance. Hence, to improve the luminous efficiency, the size of the first color LED 12 is larger than the size of the second color LED 14 or the third color LED 16 in the first embodiment. Therefore, an area of the first light-emitting surface ES1 is larger than an area of the second light-emitting surface ES2 or an area of the third light-emitting surface ES3. For a preferable example, the length of diagonal lines of the first light-emitting surface ES1 are from 100 to 500 μm, or the area of the first light-emitting surface ES1 is larger than the area of the second light-emitting surface ES2 and the third light-emitting surface ES3 for 2 to 20 times. Hence, the luminous efficiency of the first color LED 12 can be kept in an ideal range.

For the two adjacent pixel zones P (for example, pixel zones P1 and P2) on the first substrate 10, since the size of the first color LED 12 is larger than either the size of the second color LED 14 or the size of the third color LED 16, based on positions of the pixel zone P1, the pixel zone P2 and the all the LEDs disposed in the pixel zones P1 and P2, the distance between the first color LED 12 in the pixel zone P1 and another first color LED 12 in the pixel zone P2 is shorter than the distance between the second color LED 14 in the pixel zone P1 and another second color LED 14 in the pixel zone P2 or the distance between the third color LED 16 in the pixel zone P1 and another third color LED 16 in the pixel zone P2. In other words, the distance d1 between the two first color LEDs 12 disposed in the pixel zones P1 and P2 is less than the distance d2 between the two second color LEDs 14 disposed in the pixel zones P1 and P2. In summary based on the above description, the distance between the first color LED 12 and an adjacent first color LED 12 is less than the distance between the second color LED 14 and an adjacent second color LED 14.

However, for human's visual perception, an unexpected equivalent pixel is formed by the first color LED 12 disposed in the pixel zone P1 and the second color LED 14 or the third color LED 16 disposed in the pixel zone P2; therefore, it effects viewer's visual perception and makes blurry display images. In another condition, part of the light emitted by the first color LED 12 in the pixel zone P1 interferes the light emitted by the LEDs disposed in the pixel zone P2. Particularly, the light emitted by the LEDs disposed in the pixel zone P2 gains the component of the red light emitted from the pixel zone P1, and making the color shift. Hence, in this embodiment, the shading layer 18 covers part of the first light-emitting surface ES1 in the display direction V to avoid different pixels interfering each other. In addition, the display direction V is the same as the light-emitting direction of the first light-emitting surface ES1 as the previous definition.

Although the light emitted by the first color LED 12 is shielded by the shading layer 18 and making the External Quantum Efficiency (EQE) lower, the Internal Quantum Efficiency (IQE) of the first color LED 12 is increased, the total luminance of the first color LED 12 can be improved still.

The further description of the shade layer 18 is based on FIG. 2A and FIG. 2B. FIG. 2A shows the part of the first color LED 12 overlapped by the shade layer 18 in the pixel zones P, and FIG. 2B shows the cross-section of the LEDs which are uncovered by the shading layer 18 disposed in the pixel zones P. In this embodiment, the display direction V is in the positive x-axis, and the shading layer 18 is disposed on the first color LED 12 and the first substrate 10. Commonly, the first substrate 10 comprises a circuit construction. For example, a semi-conductor or a conducting wire, which electrically connects to and operates the LEDs to emit light. Since this is not a key feature in the present disclosure, there is no further description and drawing to show it.

In this embodiment, the shape of the shading layer 18 is designed as a strip and overlaps part of the first light-emitting surface ES1 (shown in FIG. 1), and another part of the first light-emitting surface ES1 is uncovered by the shading layer 18. In an embodiment, the size of the first light-emitting surface ES1 is from 50 μm to 500 μm. There is a distance d1 between the first color LED 12 and another first color LED 12 disposed in the next pixel zone (for example, sub-pixel zone P2). However, the shading layer 18 covers a part of the first color LED 12 in each pixel zone P, there is an increased distance d1' between the effective light emitting area of the first color LEDs 12 in the different sub-pixel zones (for example, those in the sub-pixel zone P1 and sub-pixel zone P2). In other words, even though the first color LED 12 has a large size, the interference problem can be solved by the overlaps provided by the shading layer 18.

As FIG. 1 shows, the shading layer 18 extends in the positive y-axis direction and overlaps the first light-emitting surface ES1 of the first color LED 12 which is in the pixel zones P1 and P3. However, in practice, the shape of the shade layer 18 also can be designed as in an island shape and partially disposed on the first light-emitting surface ES1 of the first color LED 12. People who have ordinary skill in this technical field can design the shape, thickness and material of the shading layer 18 for different applications, so they are not limited in this case.

Figure 3A:
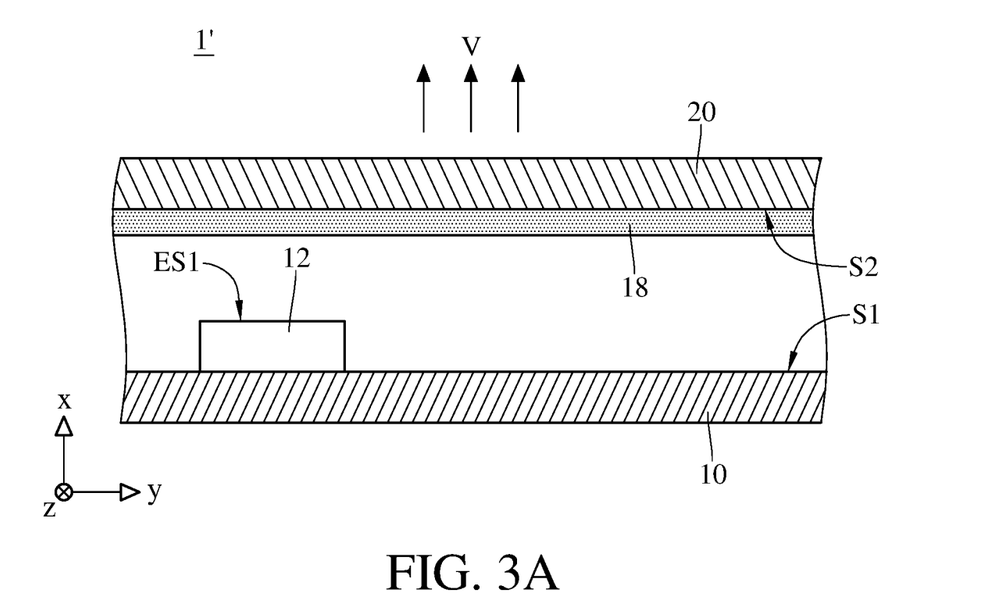
FIG. 3A is a schematic cross-sectional view showing another embodiment of a display panel according to the AA line of FIG. 1.
Figure 3B:
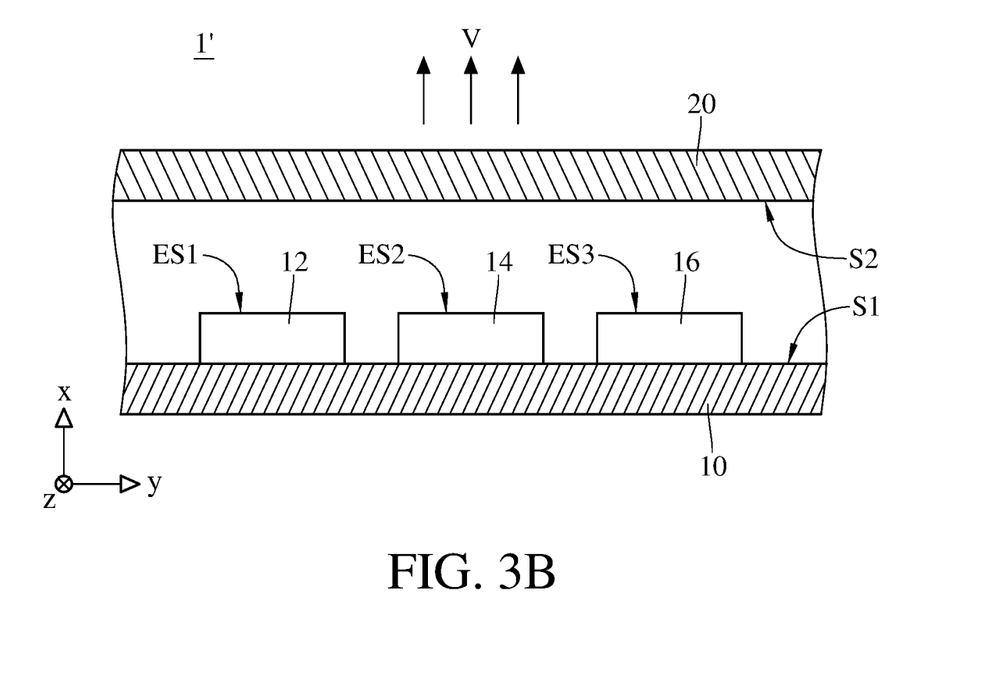
FIG. 3B is a schematic cross-sectional view showing another embodiment of a display panel according to the BB line of FIG. 1.

Please refer to FIG. 3A and FIG. 3B for further description of the shade layer. FIG. 3A and FIG. 3B show another sample of the display panel based on the first embodiment. FIG. 3A shows a cross-section schematic diagram based on the line AA in FIG. 1 for said another example, and FIG. 3B shows a cross-section schematic diagram based on the line BB in FIG. 1 for said another example. In this example, the display panel 1' further comprises a second substrate 20. Additionally, the second substrate 20 includes a second surface S2 facing the first substrate 10. The shading layer 18 is disposed on the second surface S2 of the second substrate 20, and the first color LEDs 12 and the second color LEDs 14 are disposed on the first substrate 10. In other words, instead of covering onto the first color LEDs 12 and the first substrate 10 by the shading layer 18 directly, there is a distance between the shading layer 18 and the first substrate 10. As FIG. 3A shows, the first light-emitting surface ES1 of the first color LED 12 is overlapped by the shading layer 18 in the display direction V; thus, the shading layer 18 blocks the light emitted by the first color LED 12 in the display direction V. In this embodiment, the second substrate 20 is a substrate with a property of high transparency, such as a glass substrate, a sapphire substrate or a polymer film. The shading layer 18 can be made by black matrix resists, opaque materials, multilayered Chromium film or resins.

Based on the above structure, the size of the LED Chip of the first color LED 12 is large for increasing its luminous efficiency. On the other hand, the light emitted by the first light-emitting surface ES1 of the first color LED 12 can be partly blocked in the display direction V by the shading layer 18 and the problem of light interference between adjacent pixel zones P will be improved.

Figure 4A:
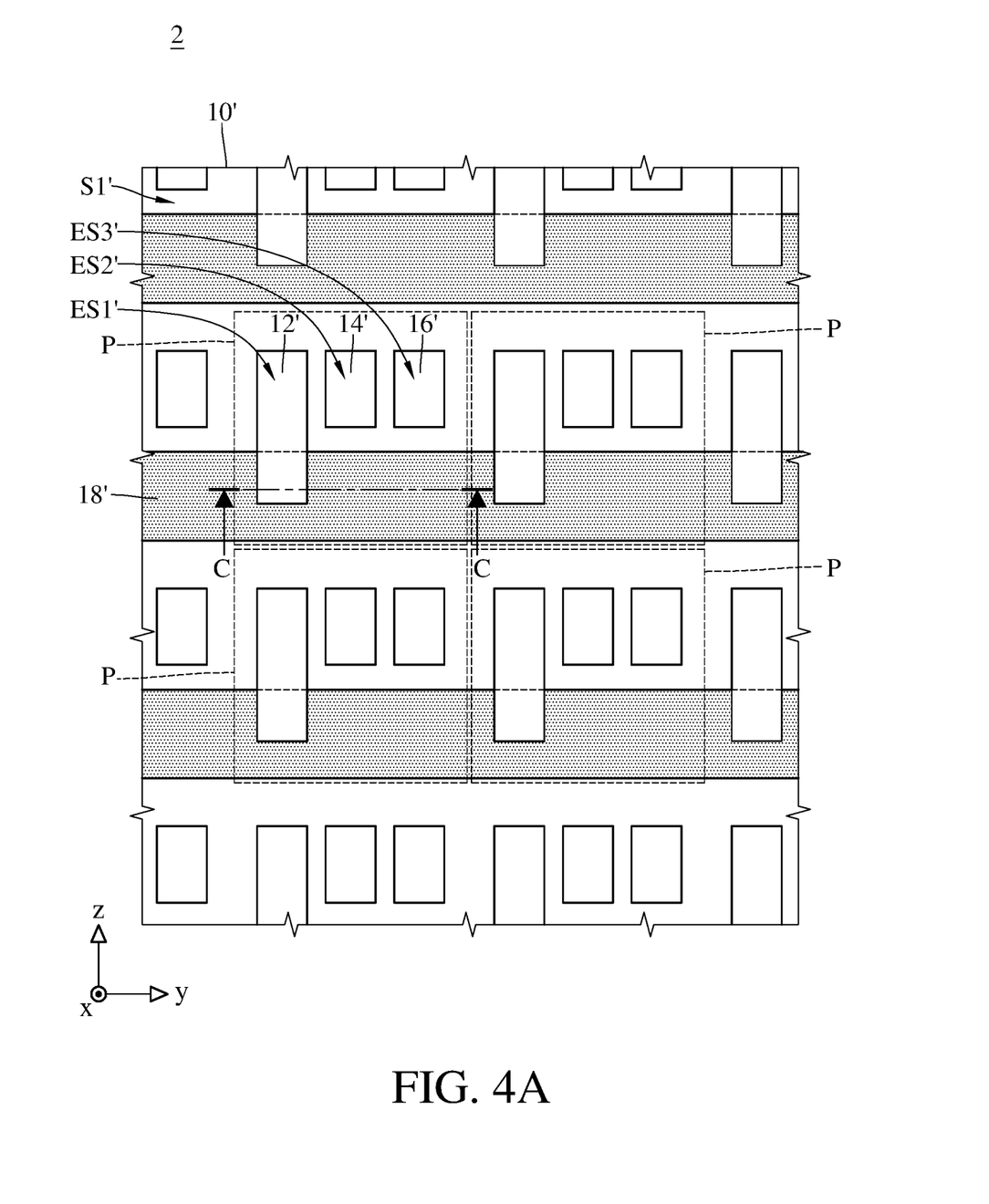
FIG. 4A is a schematic cross-sectional view of the AA line of FIG. 1 which showing another type of Light Emission of the display panel according to second embodiment.
Figure 4B:
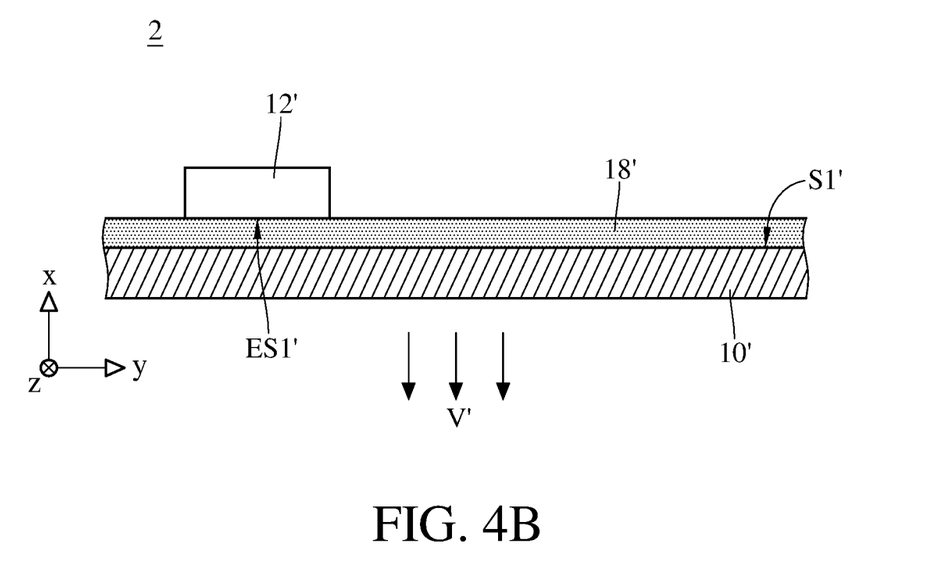
FIG. 4B is a schematic cross-sectional view of the BB line of FIG. 1 which showing another type of Light Emission of the display panel according to second embodiment.

Please refer to FIG. 4A and FIG. 4B. FIG. 4A is an overlook schematic diagram according to the display panel of the second embodiment, and FIG. 4B is a cross-sectional schematic diagram according to the CC line in FIG. 4A. A display panel 2 is similar to the display panel 1 in FIG. 1, wherein the display panel 2 comprises a first substrate 10', a plurality of first color LEDs 12', a plurality of second color LEDs 14', a plurality of third color LEDs 16' and a shading layer 18'. A main difference between this embodiment and the first embodiment lies in that, in this embodiment, the shading layer 18' of the display panel 2 is disposed on the first surface S1' of the first substrate 10', and the first color LED 12' is disposed on the shade layer 18'. Furthermore, the display direction V' is in the negative x-axis direction. Namely, the FIG. 1 to the FIG. 3B show the embodiments of the upward light-emitting structures, and both of the FIG. 4A and the FIG. 4B show the downward light-emitting structures. Said up light-emitting structure and the down light-emitting structure are defined based on the light-emitting direction from the display panel, which points to the first substrate or points away from the first substrate. As FIG. 4B shows, the shading layer 18' is disposed between the first substrate 10' and the first color LED 12', and the display direction V' points away from the first surface S1'. Hence, the shading layer 18' still partially overlaps the first light-emitting surface ES1' of the first color LED 12', wherein the first light-emitting surface ES1' faces to the first substrate 10' in the display direction V'. In addition, the second color LED 14' and the third color LED 16' are not overlapped by the shading layer 18' in the display direction V'. As FIG. 4B shows, every color LED is disposed on the first substrate 10', and the viewers watch the display panel 2 from the opposite side to the first surface S1' of the first substrate 10'. Because the light emitted from the first light-emitting surface ES1' of the first color LED 12' in display direction V' is partially blocked by the shade layer 18' appropriately, the interference between the color light emitted from the two adjacent first color LEDs 12' can be avoided.

Figure 5A:
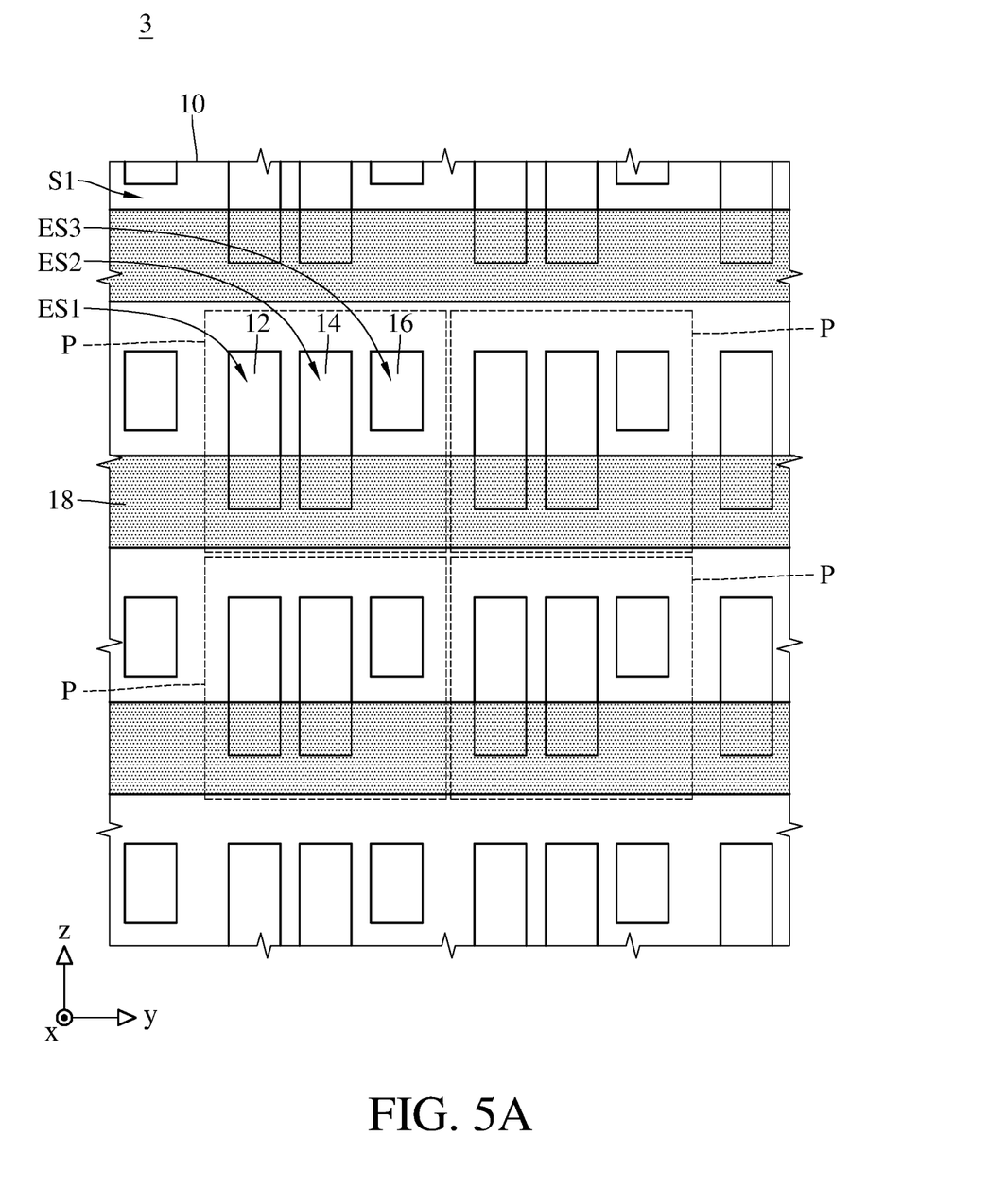
FIG. 5A is a structural schematic diagram of a display panel according to the third embodiment of the present disclosure.

Please refer to FIG. 5A. FIG. 5A is an overlook schematic diagram according to the display panel of the third embodiment. Similar to that of the embodiment shown in FIG. 1, a first substrate 10 of the third embodiment comprises a plurality of the pixel zones P and a first surface S1 facing to the display direction (positive x-axis). Every pixel zone P comprises a first color LED 12, a second color LED 14 and a third color LED 16. A first color LED 12 comprises a first light-emitting surface ES1. A second color LED 14 comprises a second light-emitting surface ES2. A third color LED 16 comprises a third light-emitting surface ES3. The first color LED 12, the second color LED 14 and the third color LED 16 are disposed on the first surface S1.

In FIG. 5A, the size of the second color LED 14 is larger than the size of the third color LED 16, so the area of the second light-emitting surface ES2 is also larger than the area of the third light-emitting surface ES3. Practically, the second color LED 14 emits the green light. Since the fluctuations of the wavelength shifting in blue color is obvious when the micro green light emitting diode (micro green LED) is made into miniature size, the wavelength-shift problem can be improved by using large size LED chip. Because human eyes are sensitive to the green light, the problem of interference between the color light emitted from different pixel zones P can be improved by disposing a shading layer 18. Also, a preferable color balance can be made by calibrating the light-emitted area of the second color LED 14. In practice, the area of the second light-emitting surface ES2 can be equal to or different from the area of the first light-emitting surface ES1. Thus, in the third embodiment, the light emitted from the first light-emitting surface ES1 of the first color LED 12 can be partially blocked by the shading layer 18. Also, the shading layer 18 overlaps part of the second light-emitting surface ES2 of the second color LED 14 in the display direction V.

Figure 5B:
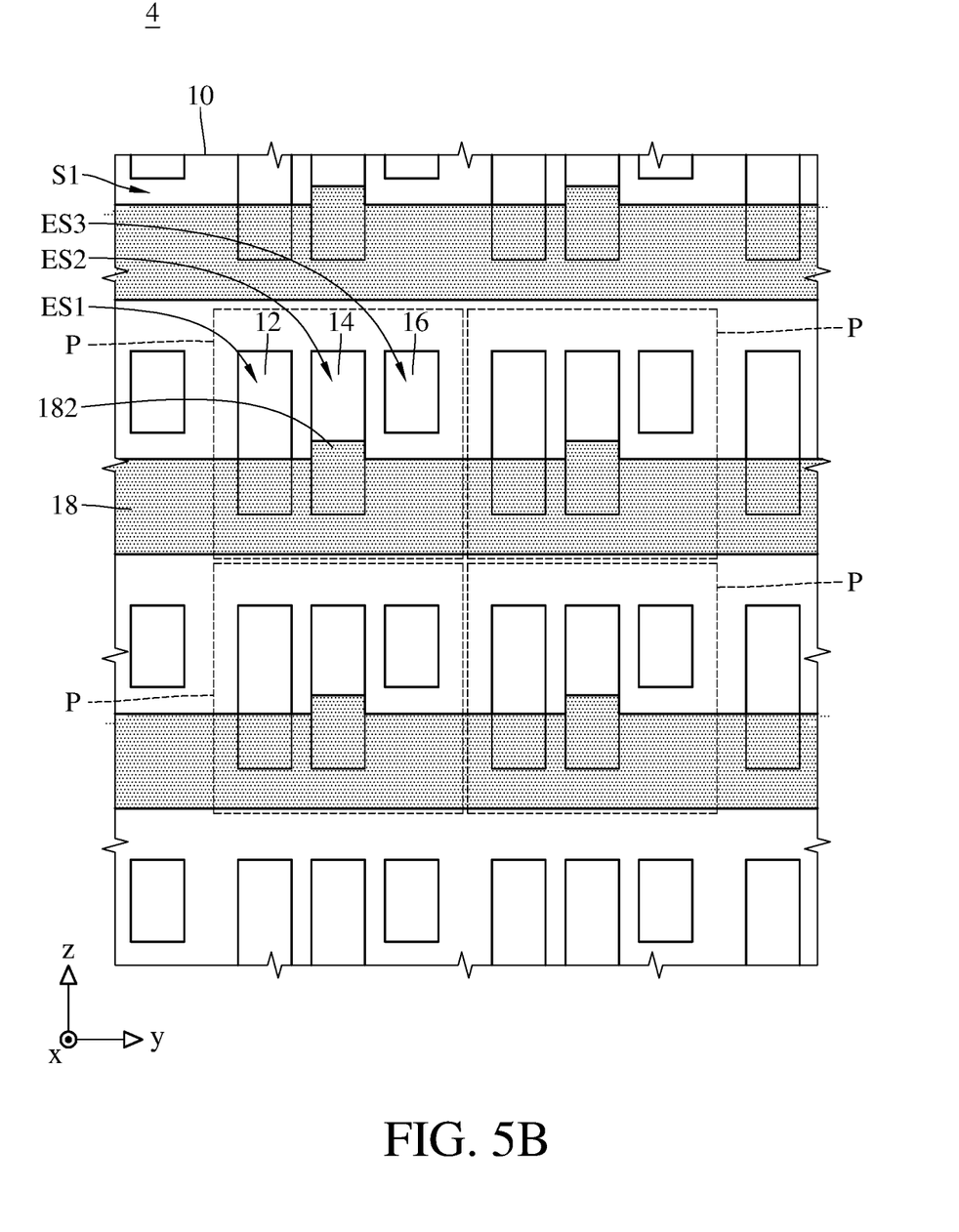
FIG. 5B is a structural schematic diagram of a display panel according to the fourth embodiment of the present disclosure.
Figure 6:
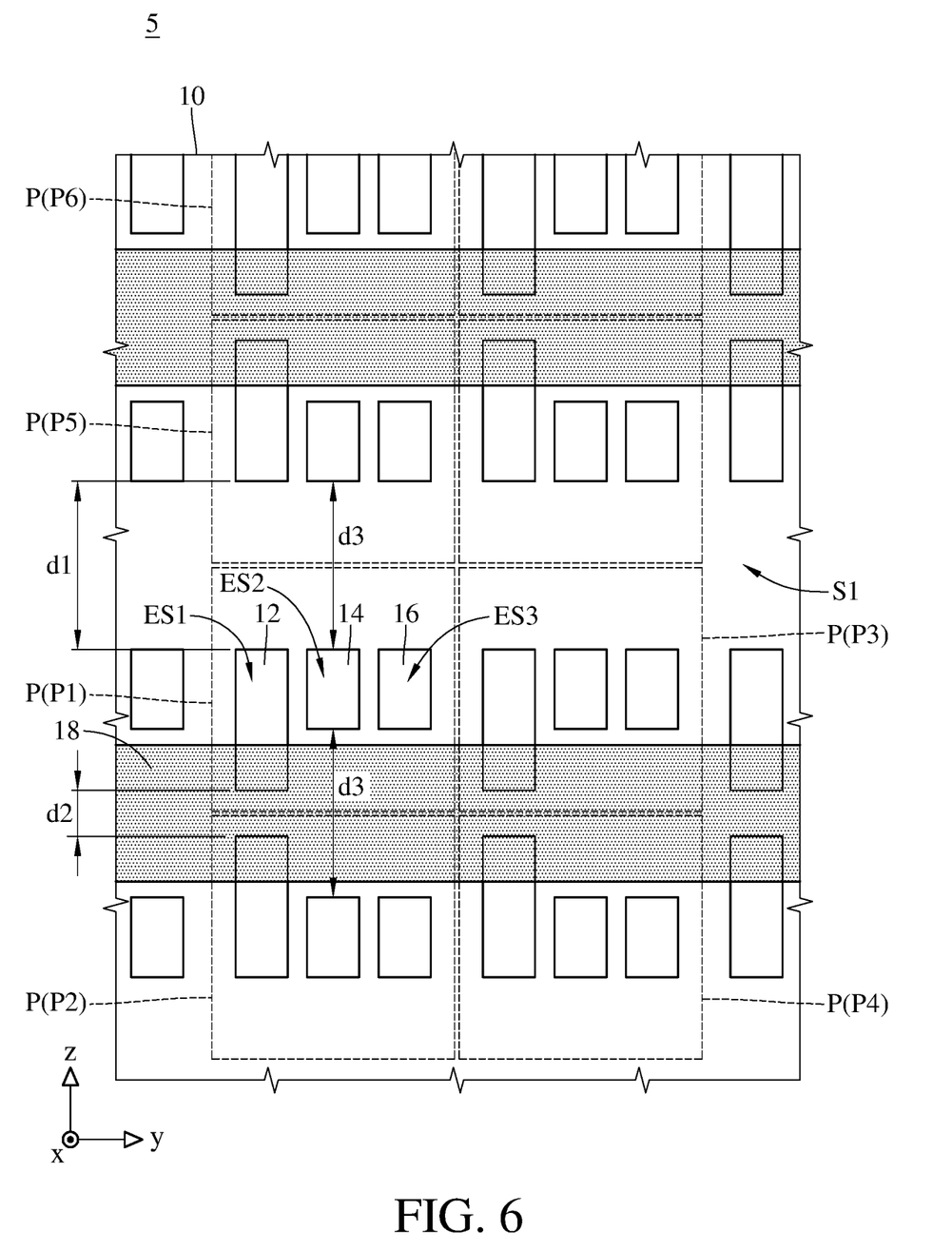
FIG. 6 is a structural schematic diagram of a display panel according to the fifth embodiment of the present disclosure.

On the other hand, as the description shown in the above, for improving the color balance, it needs to adjustments the blocked area of the light-emitting surface, which is blocked by the shading layer 18. Please refer to FIG. 5B for the detailed description. The FIG. 5B is an overlook schematic diagram according to the display panel in the fourth embodiment. In this embodiment, the display panel 4 is similar to the third embodiment shown in FIG. 5A, wherein the difference from the third embodiment is the shading layer 18 of the display panel 4 comprises an extra area 182. In addition, the extra area 182 faces to positive z-axis direction and comprises a larger overlapped area of the second light-emitting surface ES2. In other words, an area of the first light-emitting surface ES1 covered by the shading layer 18 differs from an area of the second light-emitting surface ES2 covered by the shading layer 18. Hence, the illuminance flux of the second color LED 14 disposed in each pixel zone P can be controlled appreciably by adjusting the size of the extra area 182. FIG. 5B is an example in which the second color LED 14 is overlapped partially by the extra area 182; for the same reason, the first light-emitting surface ES1 of the first color LED 12 can also be partially overlapped by the extra area 182. Please refer to FIG. 6. FIG. 6 is an overlook schematic diagram according to the display panel in the fifth embodiment. The major difference from the previous embodiments is that: the first color LED 12, the second color LED 14 and the third color LED 16 are mirror-symmetrically arranged about the axis between two pixel zones P lining in two adjacent rows. In this embodiment, two adjacent pixel zones P in two adjacent rows are mirror-symmetrical or linear symmetrical about the axis between said two adjacent rows. Additionally, there is a distance d1 from the first color LED 12 disposed in a pixel zone P (for example, pixel zone P1) to another first color LED 12 disposed in adjacent pixel zone P (for example, pixel zone P5). There is another distance d2 from the first color LED 12 disposed in the pixel zone P1 to another first color LED 12 disposed in further another pixel zone P2, with the distance d1 larger than the distance d2. In other words, the pitch between the first color LEDs disposed on the first substrate 10 is different in both the z-axis direction. The second color LEDs 14 and the third color LEDs 16 have smaller size than the first color LEDs 12. Specifically, the first color LED 12 disposed in the pixel zone P1 is closer to the first color LED 12 disposed in the pixel zone P2 than to the first color LED 12 disposed in the pixel zone P5. Therefore, a shading layer 18 is disposed between the pixel zone P1 and the pixel zone P2, and there's no shading layer 18 disposed between the pixel zone P1 and the pixel zone P5 due to the wide gap between these two LEDs.

With the above structure, the process window provided by the pattern design of the shading layer 18 can be further widen due to the arrangement of the LEDs in this embodiment, so that the shading layer 18 overlaps both of part of the first light-emitting surface ES1 in the pixel zone P1 and part of the first light-emitting surface ES1 in the pixel zone P2. Similarly, the shading layer 18 also covers part of the first light-emitting surface ES1 in the pixel zone P5 and part of the first light-emitting surface ES1 in the pixel zone P6. Although only pixel zones P1, P2, P5 and P6 are described in this embodiment, people who have ordinary skill in this technical field can design the shade layers 18 for different applications according to this embodiment.

Figure 7:
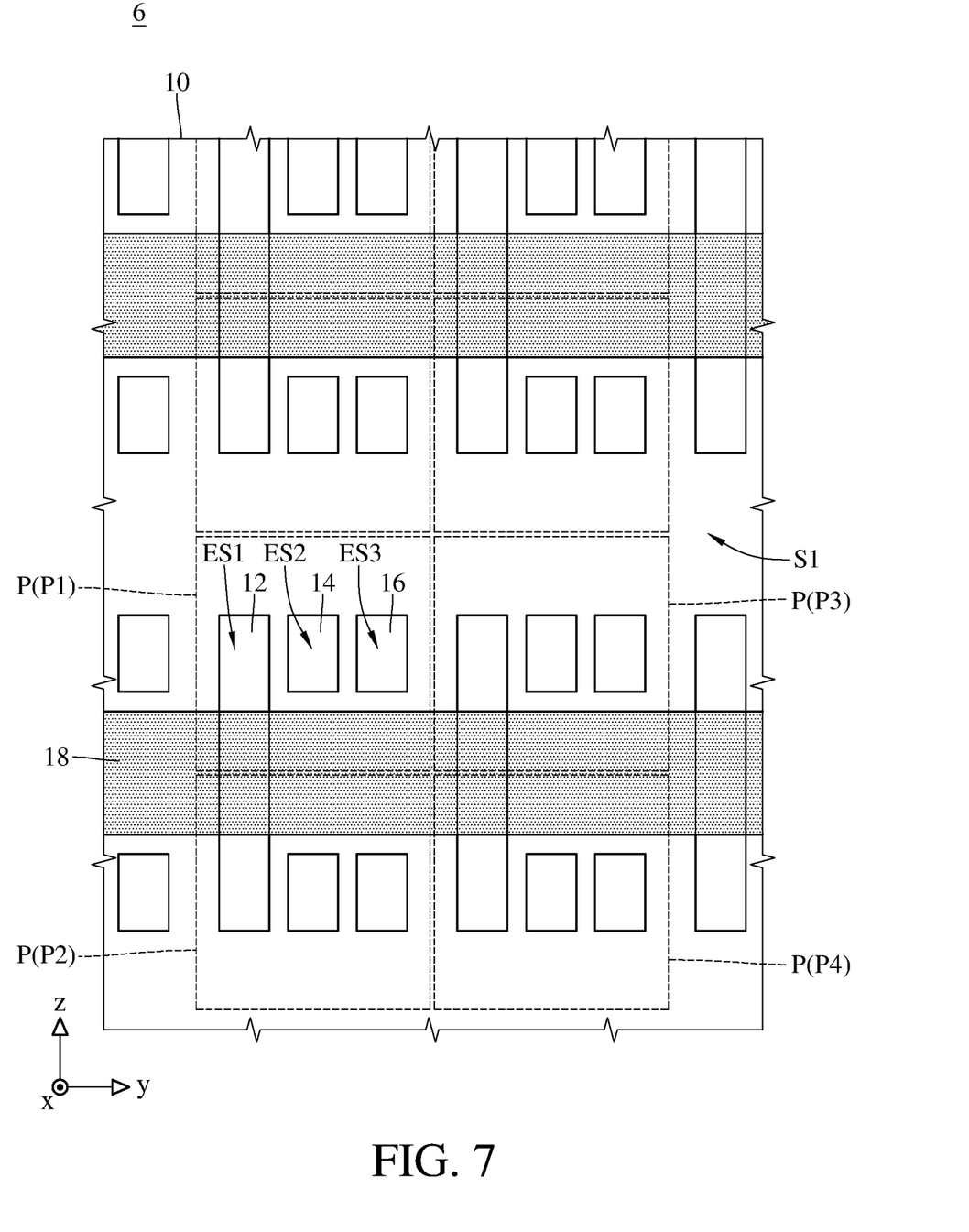
FIG. 7 is a structural schematic diagram of a display panel according to the sixth embodiment of the present disclosure.

Please refer to FIG. 7. FIG. 7 is an overlook schematic diagram according to the display panel in the sixth embodiment. The display panel 6 is similar to the fifth embodiment shown in FIG. 5 in this embodiment. The major difference from the fifth embodiment is that: two adjacent pixel zones P (for example, pixel zones P1 and P2) of the plurality of pixel zones P share one first color LED 12. Particularly, part of the first color LED 12 provides red light for the pixel zone P1, and another part of the first color LED 12 provides red light for the pixel zone P2. The shading layer 18 partially overlaps the first light-emitting surface ES1 in the display direction (positive x-axis) and is disposed between the pixel zone P1 and the pixel zone P2. Hence, the first light-emitting surface ES1 can be divided into two parts on two sides of the shading layer 18 in the pixel zone P1 and the pixel zone P2 respectively.

Figure 8:
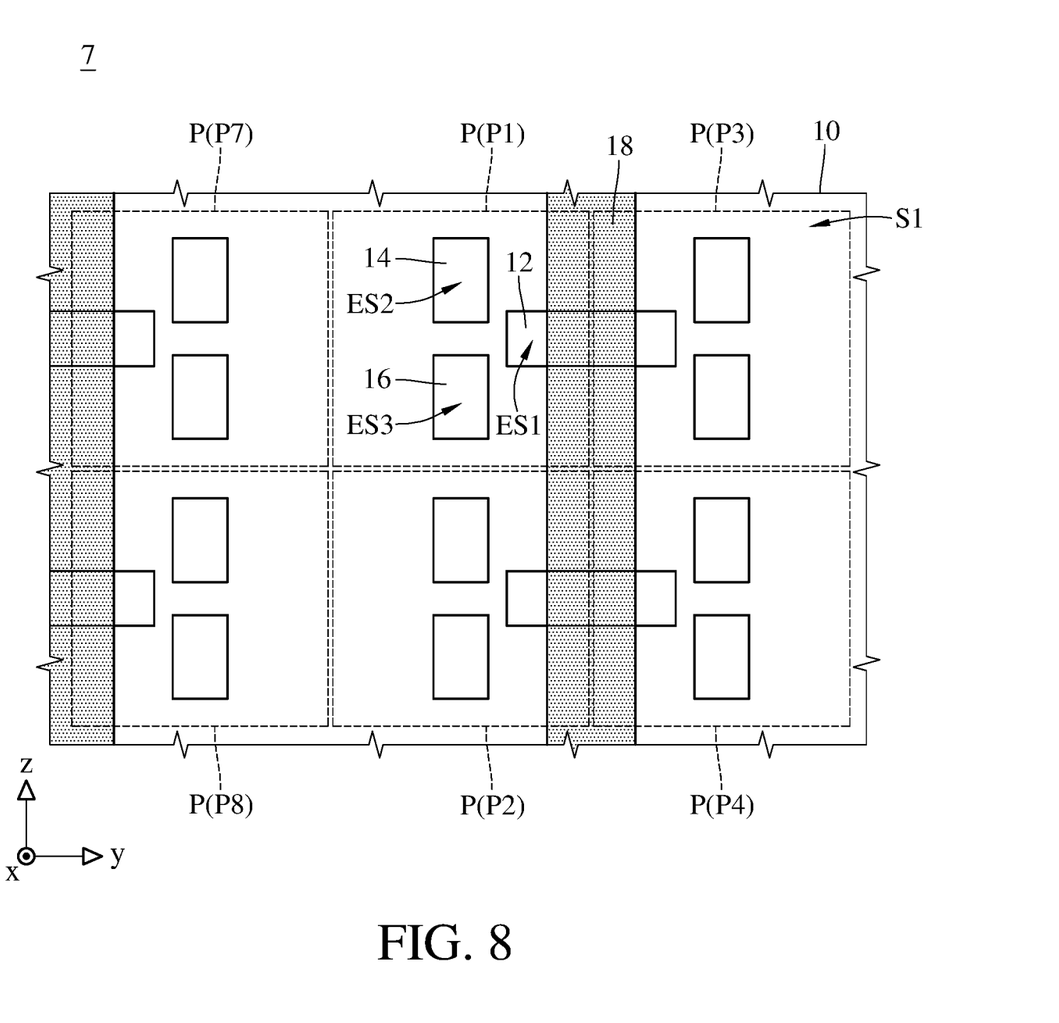
FIG. 8 is a structural schematic diagram of a display panel according to the seventh embodiment of the present disclosure.

Please refer to FIG. 8. FIG. 8 is an overlook schematic diagram according to the display panel of the seventh embodiment. The display panel 7 shown in FIG. 8 is similar to the sixth embodiment shown in FIG. 7. In this embodiment, the first color LEDs 12, the second color LEDs 14 and the third color LEDs 16 are disposed in two adjacent pixel zones P1 and P3, wherein the LEDs of the same color in these two pixel zones are mirror-symmetrically arranged about the symmetric axis between the two pixel zones P. Additionally, the shading layers 18 is disposed on the first surface S1, covers part of the first color LEDs 12 and extends in the z-axis direction. On the other hand, in this embodiment, the pixel zones P1 and P3 share one first color LED 12, and the pixel zones P2 and P4 share another one first color LED 12. The first color LEDs 12 are partially overlapped by the shading layer 18, so the related light-emitting areas in the pixel zone P1 and the pixel zone P3 can be defined. On the other hand, in the pixel zone P1, the second color LED 14 and the third color LED 16 are arranged along the z-axis direction, and the first color LED 12 is disposed on a side of the axis in which the second color LEDs 14 and the third color LEDs 16 align. Therefore, the first color LED 12, the second color LED 14 and the third color LED 16 are not collinear. Further referring to the structure in FIG. 8, since there is a larger distance between the first color LED 12 disposed in the pixel zone P1 and another first color LED 12 disposed in the pixel zone P7, the interference between the color light emitted by the pixel zone P7 and the light emitted by the first color LEDs 12 of the pixel zone P1 can be avoided without the shading layers 18.

Figure 9:
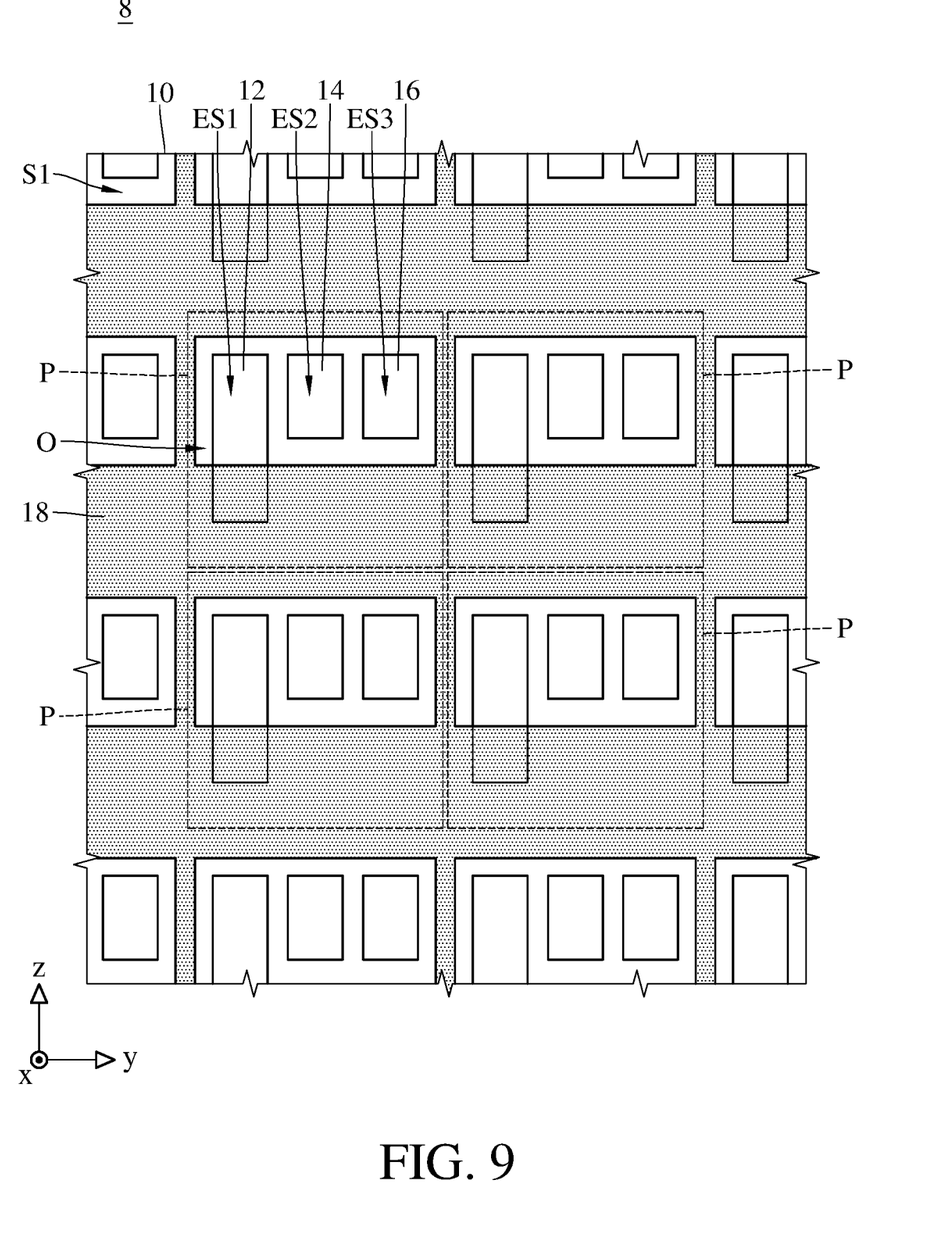
FIG. 9 is a structural schematic diagram of a display panel according to the eighth embodiment of the present disclosure.

Please refer to FIG. 9. FIG. 9 is an overlook schematic diagram according to the display panel in the eighth embodiment. In this embodiment, the display panel 8 is similar to the display panel 1 shown in FIG. 1. The major difference from the display panel 1 is that: the first substrate 10 is overlapped by the shading layers 18, and the shading layers 18 comprises a plurality of openings O. In addition, the openings O correspond to the plurality of pixel zones P respectively, and the openings O exposes part of the first light-emitting surface ES1 of the first color LED 12 and whole the second light-emitting surface ES2 of the second color LED 14. Specifically, a part of the first light-emitting surface ES1, the second light-emitting surface ES2 and the third light-emitting surface ES3 are uncovered by the shading layers 18. On the other hand, the first color LEDs 12, the second color LEDs 14 and the third color LEDs 16 are surrounded by the shading layers 18. Thus, the image contrast of the display panel 7 can be improved since the LEDs disposed in the different pixel zones are separated by the shading layers 18.

As the above descriptions, this present disclosure supplies a display panel which comprises light-emitting diodes (LEDs) with different colors, and the size of the first color LED 12 is larger than the size of the second color LED 14 or the size of the third color LED 16. In other words, the area of the first light-emitting surface ES1 is larger than the area of the second light-emitting surface ES2 or the area of the third light-emitting surface ES3. Moreover, the display panel comprises the shading layer which partially overlaps the first light-emitting surface ES1 in the display direction. Hence, the area of the light-emitting surface of the first color LED can be changed according to its luminous efficiency. Also, by the shading layers, the interference between the color light beams emitted by two adjacent pixel zones can be suppressed.

The embodiments depicted above and the appended drawings are exemplary and are not intended to be exhaustive or to limit the scope of the present disclosure to the precise forms disclosed. Many modifications and variations are possible in view of the above teachings.

What is claimed is:

1. A Micro LED display panel comprising:
a first substrate having a plurality of pixel zones arranged in an array form, wherein each of the pixel zones comprises a first color LED and a second color LED, the first color LED comprises a first light-emitting surface facing to a display direction, the second color LED comprise a second light-emitting surface facing to the display direction, and an area of the first light-emitting surface is larger than an area of the second light-emitting surface; and;
a shading layer disposed in the plurality of pixel zones, wherein the shading layer covers part of the first light-emitting surfaces;
wherein a distance between two adjacent first color LEDs is less than a distance between two adjacent second color LEDs.

2. The display panel according to claim 1, wherein each of the pixel zones further comprises a third color LED with a third light-emitting surface, and the third light-emitting surface facing to the display direction.

3. The display panel according to claim 2, wherein the third light-emitting surface is not covered by the shading layer.

4. The display panel according to claim 3, wherein the area of the second light-emitting surface is larger than an area of the third light-emitting surface, and the shading layer overlaps part of the second light-emitting surfaces.

5. The display panel according to claim 4, wherein an area of the first light-emitting surface covered by the shading layer differs from an area of the second light-emitting surface covered by the shading layer.

6. The display panel according to claim 1, wherein the first color LED and the second color LED are disposed between the shading layer and the first substrate.

7. The display panel according to claim 6, further comprising a second substrate, wherein the shading layer is disposed on the second substrate, and the first color LEDs and the second color LEDs are electrically connected to and disposed on the first substrate.

8. The display panel according to claim 1, wherein two adjacent pixel zones of the plurality of pixel zones share the first color LED.

9. The display panel according to claim 1, wherein the shading layer comprises a plurality of openings corresponding to the plurality of pixel zones, and the plurality of openings expose part of the first light-emitting surface of the first color LED and the second light-emitting surface of the second color LED.

10. The display panel according to claim 1, wherein the shading layer is disposed on the first substrate and is between the first color LED and the first substrate.

* * * * *